United States Patent [19]

Yamaguchi

[11] 4,404,528

[45] Sep. 13, 1983

[54] OUTPUT AMPLIFIER

[75] Inventor: Hiroyasu Yamaguchi, Yokohama, Japan

[73] Assignee: Tokyo Shibaura Denki Kabushiki Kaisha, Kawasaki, Japan

[21] Appl. No.: 301,439

[22] Filed: Sep. 11, 1981

[30] Foreign Application Priority Data

Sep. 16, 1980 [JP] Japan ................................ 55/128339

[51] Int. Cl.³ ........................... H03F 3/04; H03F 3/26
[52] U.S. Cl. .................................... 330/288; 330/263; 330/273
[58] Field of Search ............... 330/262, 263, 267, 268, 330/273, 274, 288, 296; 323/315, 316; 307/296–297

[56] References Cited

U.S. PATENT DOCUMENTS 3,534,279 10/1970 Limberg .............................. 330/296

Primary Examiner—James B. Mullins
Assistant Examiner—Gene Wan
Attorney, Agent, or Firm—Cushman, Darby & Cushman

[57] ABSTRACT

An output amplifier comprises an output transistor and a biasing transistor whose emitter is connected to the emitter of the output transistor. The polarity of the biasing transistor is the same as that of the output transistor. Resistors of small resistance are connected to the collector and base of the biasing transistor, respectively. The other ends of these resistors are connected to the base of the output transistor. When an input signal in the positive cycle is applied to the base of the output transistor, the circuit comprising the biasing transistor and the resistors operates as a resistance circuit. On the other hand, when no signal is applied to the base of the output transistor, or when a signal in the negative cycle is applied to the base of the output transistor, the circuit operates as a current mirror circuit. Therefore, when the output transistor is cut off, the biasing transistor is simultaneously cut off.

3 Claims, 4 Drawing Figures

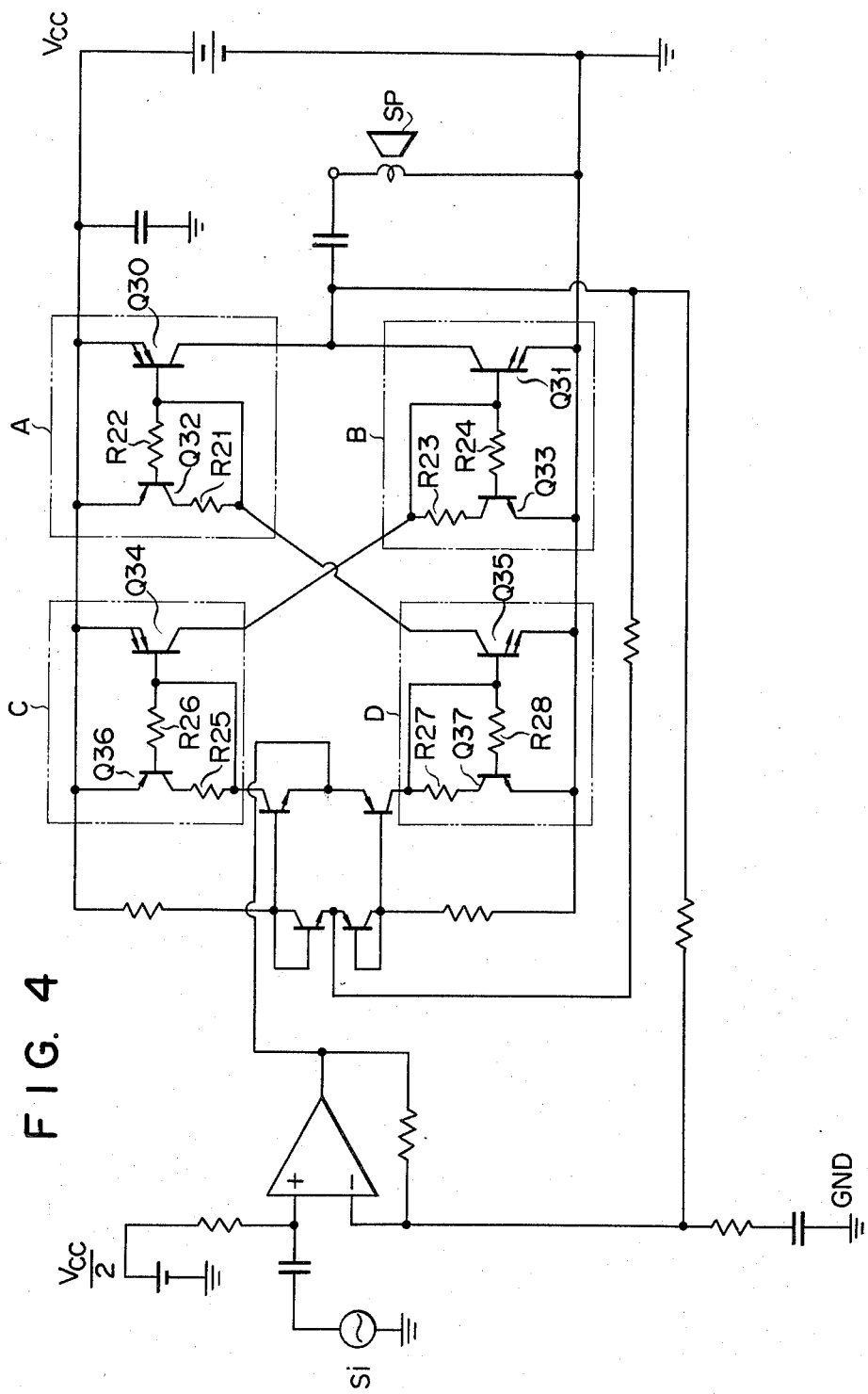
F I G. 4

OUTPUT AMPLIFIER

BACKGROUND OF THE INVENTION

The present invention relates to an output amplifier, and more particularly to an output amplifier employed for an SEPP (Single Ended Push-Pull) power amplifier.

When a conventional output amplifying circuit is employed for an SEPP power amplifier which is arranged to perform a B or AB class operation, prestage circuits of output transistors of the output amplifying circuit are not immediately cut off even after the output transistors are cut off. This causes an operation lag between the operating condition of the output transistors and the operating condition of the prestage circuits, resulting in output waveform distortions.

In any arrangement of the conventional SEPP power amplifier of A, B or AB class, when no signals are generated (at idling), the idling current of the output transistors changes greatly when the bias current for the output transistors changes. Thus, setting and control of the idling current has been difficult.

The distortion problem mentioned above may be mainly encountered in semi-complementary SEPP power amplifiers when the circuits are formed by integrated circuits.

SUMMARY OF THE INVENTION

The object of the present invention is, therefore, to provide an output amplifier in which output waveform distortions and changes in the idling current corresponding to changes in the bias current are reduced. The object has been attained by the output amplifier which comprises: an output transistor; a biasing transistor whose emitter is connected to the emitter of said output transistor and whose polarity is the same as the polarity of said output transistor; a first resistor connected to the collector of said biasing transistor; and a second resistor connected to the base of said biasing transistor, the other end of said second resistor being connected to the other end of said first resistor, a node of said first and second resistors being connected to the base of said output transistor and a signal being input at said node; whereby a circuit consisting of said transistor, and said first and second resistors operates as a current mirror circuit when a small current is applied and as a resistance circuit when a large current is applied.

The present invention thus provides an arrangement in which a circuit comprising a transistor and two resistors operates as a current mirror circuit for an output transistor when a small current is applied and as a resistance circuit for the output transistor when a large current is applied. Therefore, when output transistors are cut off, the prestage transistors are simultaneously cut off. The operation lag between the operating conditions of the output transistors and the prestage transistors is eliminated, thus decreasing output waveform distortions.

Further, according to the present invention, the idling current of the output transistor is univocally determined in a form of a linear function by a current flowing through the prestage transistors. Thus, changes in the idling current mentioned above are decreased.

Further, according to the invention, since the biasing transistor operates just as a resistor rather than a diode acting as a current mirror when it is applied with a large current, the invention can be easily applied to a large power drive circuit.

BRIEF DESCRIPTION OF THE DRAWINGS

By way of examples and to make the description clearer, reference is made to the accompanying drawings in which:

FIG. 4 is a circuit diagram of another embodiment in which the present invention is employed for another SEPP power amplifier.

DETAILED DESCRIPTION OF THE PREFERRED EMBODIMENTS

Figure 1:
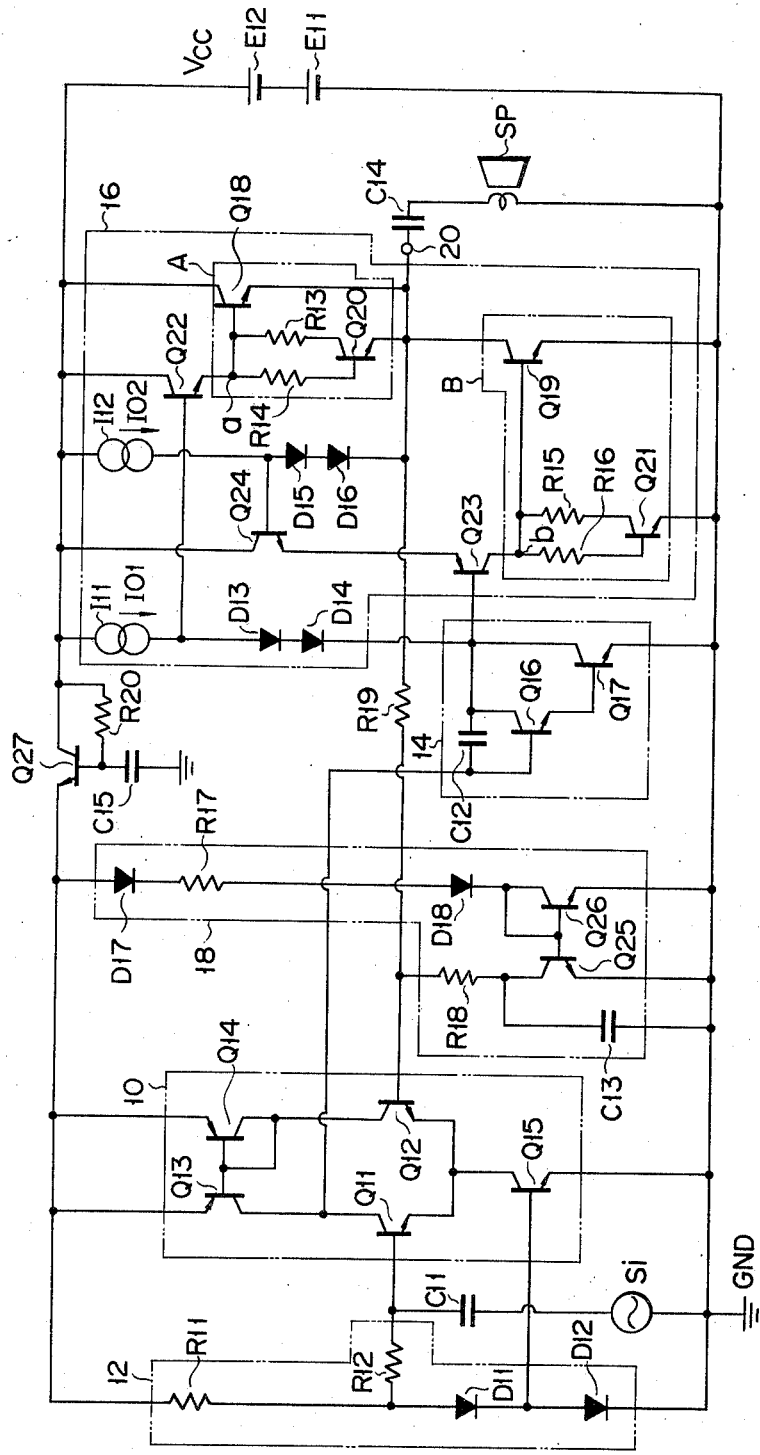
FIG. 1 is a circuit diagram of one embodiment in which the present invention is employed for an SEPP power amplifier.

FIG. 1 is a circuit diagram of one embodiment in which the present invention is employed for an SEPP power amplifier. In FIG. 1, a differential amplifier 10 comprises npn transistors Q11 and Q12 which constitute a differential pair, pnp transistors Q13 and Q14 which form a current mirror circuit, and an npn transistor Q15 connected to the differential pair and utilized for a constant current source. The current mirror circuit is connected to the collectors of the transistors Q11 and Q12 and acts as a collector load.

The bases of the transistor Q11 and the transistor Q15 are connected to a base bias circuit 12. The base bias circuit 12 comprises a resistor R11 and diodes D11 and D12 all connected in series, and a resistor R12 connected to a node of the resistor R11 and the diode D11.

A signal source Si is connected to the base of the transistor Q11 through a capacitor C11. A signal which is amplified at the differential amplifier 10 is fed from the collector of the transistor Q11 to a drive circuit 14.

The drive circuit 14 comprises a Darlington circuit of npn transistors Q16 and Q17. A capacitor C12 is connected between the collector and base of the transistor Q16. The drive circuit 14 drives a semi-complementary output SEPP stage 16.

The semi-complementary output SEPP stage 16 has npn transistors Q18 and Q19 as output transistors. The emitter of an npn transistor Q20 is connected to the emitter of the output transistor Q18. Resistor R13 and R14 are respectively connected to the collector and base of the transistor Q20. A node of these resistors R13 and R14 is connected to the base of the output transistor Q18. The transistors Q18 and Q20, and the resistors R13 and R14 constitute a circuit A.

The emitter of an npn transistor Q21 is connected to the emitter of the output transistor Q19. Resistors R15 and R16 are respectively connected to the collector and base of the transistor Q21. A node of these resistors R15 and R16 is connected to the base of the output transistor Q19. The transistors Q19 and Q21, and resistors R15 and R16 constitute a circuit B. The circuits A and B are the output amplifier according to the present invention.

The output transistor Q18 and an npn transistor Q22 form a Darlington circuit. The base of the transistor Q22 is connected to the drive circuit 14 through diodes D13 and D14. The signal is input through the diodes D13 and D14. A constant current source I11 is connected to the base of the transistor Q22.

A complementary pnp transistor Q23 is connected at its collector to the base of the output transistor Q19. The base of the transistor Q23 is connected with the drive circuit 14 from which the signal is fed. The emitter of the transistor Q23 is connected to the collector of the output transistor Q19 through an npn transistor Q24 and a series circuit of diodes D15 and D16. The transistor Q19, Q23, and Q24 constitute a composite pnp transistor.

An output voltage shift circuit 18 comprises npn transistors Q25 and Q26 which form a current mirror circuit; a series circuit of a diode D17, a resistor R17 and a diode D18 which is connected to the collector of the transistor Q26; and a resistor R18 and a capacitor C13 connected to the collector of the transistor Q25. The output voltage shift circuit 18 sets the operation voltage at an output terminal 20 connected thereto through a resistor R19 to one-half the power source voltage (Vcc) of power sources E11 and E12.

A speaker SP is mounted through a capacitor C14 between the output terminal 20 and the negative terminal of the power source. If the SEPP amplifier is of an OCL type where two power sources (positive and negative) are used, the capacitor C14 is unnecessary and the speaker SP is connected between the output terminal 20 and the node of power sources E11 and E12. In the figure, an npn transistor Q27, a resistor R20 and a capacitor C15 form a power source ripple filter circuit.

The mode of operation of the embodiment according to the present invention will now be described below. When an input signal is fed from the signal source Si to the base of the transistor Q11 through the capacitor C11, the input signal is amplified at the differential amplifier 10 and the amplified signal is then fed from the transistor Q11 to the drive circuit 14. The amplified input signal is fed by the drive circuit 14 to the base of the transistor Q22 through the diodes D13 and D14 as well as directly to the base of the transistor Q23. As a result, the output transistors Q18 and Q19 perform a push-pull operation. By this operation, a drive current is obtained to drive the speaker SP.

Figure 2:
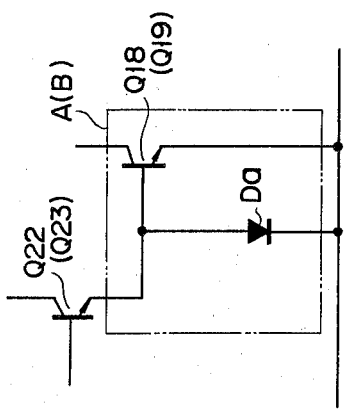
FIG. 2 is an equivalent circuit diagram of a circuit A or B shown in FIG. 1 when a small current is applied.

The mode of operation of the circuits A and B will be described in detail. When the base (node a) of the output transistor Q18 is at a potential of no signal (or only a small signal almost similar to no signal) or at a lower potential as the voltage is in the negative cycle of the signal, the current at the node a is very small so that the voltage drops across the resistors R13 and R14 are negligible. As a result, the circuit A is the same as a circuit which does not include the resistors R13 and R14, and it thus operates as a current mirror circuit. FIG. 2 shows an equivalent circuit diagram of the circuit A in the above operation. A diode Da is equivalent to the base and emitter junction of the transistor Q20.

The circuit B also operates in the same manner as the circuit A. When, the base (node b) of the output transistor Q19 is at a potential of no signal (or only a small signal almost the same as no signal) or at a lower potential as the voltage is in the negative cycle of the signal, the circuit B operates as a current mirror circuit. In this case, the equivalent circuit diagram of the circuit B is as shown in FIG. 2.

Direct current voltage V across the node a and the emitter of the transistor Q20 or across the node b and the emitter of the transistor Q21 is given by the following equation:

$$V = V_{BE} + \frac{R_a \cdot I}{hFE} \quad (1)$$

where VBE is the forward bias voltage between the emitter and base of the transistor Q20 or between the emitter and base of the transistor Q21, Ra is the resistance of the resistor R14 or R16, I is the collector current of the transistor Q20 or Q21, and hFE is the current-amplification factor of the transistor Q20 or Q21.

Since Ra is small and hFE is very large, the equation (1) becomes $V \approx V_{BE}$. The circuits A and B operate as current mirror circuits.

In this case, the emitter current ratios of the transistor Q18 to the transistor Q20 and of the transistor Q19 to the transistor Q21 are determined by the respective emitter area ratios when these transistors have substantially the same characteristics.

When the circuit A is operated as the current mirror circuit, the emitter current of the transistor Q22 changes in proportion to the emitter current of the output transistor Q18. When the output transistor Q18 is cut off, the transistor Q22 is simultaneously cut off.

The circuit B operates in the same manner as the circuit A. The emitter currents of the transistors Q23 and Q24 change in proportion to the emitter current of the output transistor Q19. When the output transistor Q19 is cut off, the transistors Q23 and Q24 are simultaneously cut off.

As described above, according to the embodiment of the present invention, the following effects are obtained.

(1) When the bases of the output transistors Q18 and Q19 are at a potential of no signal (or only a small signal quite similar to no signal is input to the base) or at a lower potential, the circuits A and B operate as current mirror circuits. As a result, when the output transistor Q18 or Q19 is cut off, the transistor Q22 or transistors Q23 and Q24 are simultaneously cut off. Therefore, when the SEPP power amplifier is to be operated in the class B or AB, an operation lag between the output transistor Q18 and the prestage circuits or between the output transistor Q19 and the prestage circuits does not occur, thus eliminating the output waveform distortions.

However, in the conventional construction, resistors and constant current sources are simply connected between the base and emitter of the output transistor Q18 or Q19. When the output transistor Q18 or Q19 is cut off, the prestage transistors are not immediately cut off. Thus, the output waveforms are distorted.

Especially when the SEPP power amplifier is formed as a monolithic integrated circuit and a lateral pnp transistor with low transition frequency fT is used for the transistor Q23, the construction results in increased output waveform distortions. However, the arrangement according to the present invention decreases the output waveform distortions greatly.

(2) When no signal is fed, the emitter current of the transitor Q22 or the transistors Q23 and Q24 is proportional to the emitter current of the corresponding output transistor Q18 or Q19. Therefore, the idling current of the output transistors Q18 and Q19 fluctuates in one-to-one correspondence with the fluctuations of currents I01 and I02 which are respectively flowing through the biasing diodes D13 and D14 and the biasing diodes D15 and D16. Therefore, the SEPP power amplifier performs uniformly and stably, and the manufacturing process is simplified.

On the other hand, when the resistors and constant current sources are simply connected between the bases and emitters of the output transistors Q18 and Q19, the currents I01 and I02 are amplified several times, which affects the idling current. Thus, the idling currents of the output transistors Q18 and Q19 are greatly changed.

Concerning the relationship between the idling currents (Ic idle) of the output transistors Q18 and Q19 and the currents I01 and I02, the embodiment of the present invention and the conventional case satisfy the relations of equations (2) and (3) below, respectively.

The embodiment of the present invention satisfies the relation given by the following equation:

$$Ic \text{ idle} = K \sqrt{I01 \cdot I02} \quad (2)$$

The conventional case satisfies the relation given by the following equation:

$$Ic \text{ idle} = K' I01^2 I02^2 \quad (3)$$

where K and K' are constants. According to equation (3), the current fluctuation of currents I01 and I02 are squared, affecting the idling current in the conventional arrangement.

This second effect is effective when the SEPP power amplifier is operated in class B or AB.

(3) When the signal fed to the node a or b changes in the positive cycle, that is, when the emitter current of the transistor Q20 or Q21 tends to increase, the collector-emitter voltage of the transistor Q20 or Q21 tends to be saturated due to the existence of the collector resistance R13 or R15.

Figure 3:
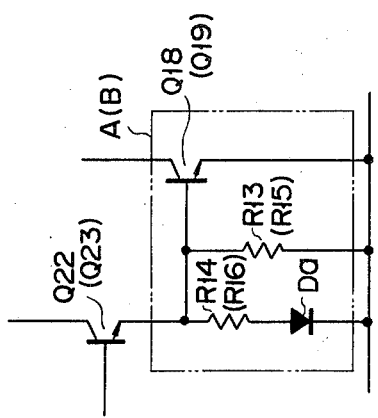
FIG. 3 is an equivalent circuit diagram of the circuit A or B shown in FIG. 1 when a large current is applied.

In this case, the equivalent circuit diagram of the circuit A or B is shown in FIG. 3. The diode Da is equivalent to the base and emitter junction of the transistor Q20 or Q21. Therefore, when a signal in the positive cycle is applied to the node a or b, the circuit A or B operates in the same manner as in the conventional arrangement of the SEPP power amplifier. Resistors of about 10Ω to several KΩ are used for the resistors R13 and R15 so that the base drive of the output transistors Q18 and Q19 is performed sufficiently. The resistance of the resistors R13 and R15 is preferably selected so that the voltage across the collectors and emitters of the transistors Q20 and Q21 may not saturate.

The present invention is not limited to the above embodiment. In this embodiment, the output transistor Q18 or Q19 is arranged to be cut off when a signal in the negative half-cycle is fed to the node a or b. This arrangement is popular. However, this embodiment is not limited to this arrangement. For example, a B class SEPP power amplifier may be arranged so that the output transistor Q18 or Q19 is not cut off by connecting a current source which supplies a small current to the nodes a and b.

Further, in the above embodiment, the present invention is employed in the semi-complementary SEPP power amplifier. However, the present invention is not limited to this application. For example, an output amplifier according to the present invention can be applied to a SEPP power amplifier as shown in FIG. 4. The output amplifier according to the present invention is employed for circuits A, B, C and D of FIG. 4. In FIG. 4, an arrangement where only one of circuits C and D is used may also work. Of course, necessary modifications are required for the arrangement. The SEPP power amplifier in which the present invention is utilized may be used for applications other than the amplification of audio signals. Further, according to the invention, the current gain of the transistor Q20 or Q21 acting as a current mirror may be set larger than the emitter area ratio by connecting a resistor to its emitter.

Various changes and modifications can be provided within the scope and spirit of the present invention.

What is claimed is:

1. An output amplifier comprising:
   an output transistor;
   a biasing transistor whose emitter is connected to the emitter of said output transistor and whose polarity is the same as the polarity of said output transistor;
   a first resistor connected to the collector of said biasing transistor; and
   a second resistor connected to the base of said biasing transistor, the other end of said second resistor being connected to the other end of said first resistor, a node of said first and second resistors being connected to the base of said output transistor, and a signal being input at said node;
   whereby a circuit comprising said biasing transistor and said first and second resistors operates as a current mirror circuit when a small current is applied and as a resistance circuit when a large current is applied.

2. An SEPP power amplifier comprising:
   a first output transistor;
   a first biasing transistor whose emitter is connected to the emitter of said first output transistor and whose polarity is the same as the polarity of said first output transistor;
   a first resistor connected to the collector of said first biasing transistor;
   a second resistor connected to the base of said first biasing transistor, the other end of said second resistor being connected to the other end of said first resistor, a node of said first and second resistors being connected to the base of said first output transistor, and a first signal being input at said node;
   a second output transistor connected to said first output transistor so as to form an SEPP output circuit, an output being produced from a node of said first and second output transistor;
   a second biasing transistor whose emitter is connected to the emitter of said second output transistor and whose polarity is the same as that of said second output transistor;
   a third resistor connected to the collector of said second biasing transistor; and
   a fourth resistor connected to the base of said second biasing transistor, the other end of said fourth resistor being connected to the other end of said third resistor, a node thereof being connected to the base of said second output transistor, and a second signal of opposite phase to said first signal being input at said node;
   whereby a circuit comprising said first biasing transistor and said first and second resistors and a circuit comprising said second biasing transistor and said third and fourth resistors operate as current mirror circuits when a small current is applied and as resistance circuits when a large current is applied.

3. The SEPP power amplifier according to claim 2, wherein said first and second output transistors are connected at their bases to first and second amplifying circuits;

said first amplifying circuit comprising a third output transistor whose collector is connected to the base of said first output transistor;
   a third biasing transistor whose emitter is connected to the emitter of said third output transistor and whose polarity is the same as the polarity of said third output transistor;
   a fifth resistor connected to the collector of said third biasing transistor;
   a sixth resistor connected to the base of said third biasing transistor, the other end of said sixth resistor being connected to the other end of said fifth resistor, a node of said fifth and sixth resistors being connected to the base of said third output transistor;
   said second amplifying circuit comprising a fourth output transistor whose collector is connected to the base of said second output transistor;
   a fourth biasing transistor whose emitter is connected to the emitter of said fourth output transistor and whose polarity is the same as the polarity of said fourth output transistor;
   a seventh resistor connected to the collector of said fourth biasing transistor;
   an eighth resistor connected to the base of said fourth biasing transistor, the other end of said eighth resistor being connected to the other end of said seventh resistor, a node of said seventh and eighth resistors being connected to the base of said fourth output transistor.

* * * * *